United States Patent
Muramatsu et al.

(10) Patent No.: US 8,513,140 B2
(45) Date of Patent: Aug. 20, 2013

(54) POST-DRY ETCHING CLEANING LIQUID COMPOSITION AND PROCESS FOR FABRICATING SEMICONDUCTOR DEVICE

(75) Inventors: Masafumi Muramatsu, Kanagawa (JP); Kazumi Asada, Kanagawa (JP); Yukino Hagino, Kanagawa (JP); Atsushi Okuyama, Kanagawa (JP); Takahito Nakajima, Yokkaichi (JP); Kazuhiko Takase, Yokohama (JP); Yoshihiro Uozumi, Yokohama (JP); Tsuyoshi Matsumura, Hiratsuka (JP); Takuo Ohwada, Tokyo (JP); Norio Ishikawa, Soka (JP)

(73) Assignees: Sony Corporation, Tokyo (JP); Kabushiki Kaisha Toshiba, Tokyo (JP); Kanto Kagaku Kabushiki Kaisha, Tokyo (JP)

( * ) Notice: Subject to any disclaimer, the term of this patent is extended or adjusted under 35 U.S.C. 154(b) by 26 days.

(21) Appl. No.: 12/924,288

(22) Filed: Sep. 23, 2010

(65) Prior Publication Data

US 2011/0014793 A1    Jan. 20, 2011

Related U.S. Application Data

(62) Division of application No. 11/145,731, filed on Jun. 6, 2005, now abandoned.

(30) Foreign Application Priority Data

Jun. 4, 2004    (JP) .................................. 2004-166571

(51) Int. Cl.
    *H01L 21/302*    (2006.01)
(52) U.S. Cl.
    USPC ............ 438/745; 438/747; 438/754; 438/756
(58) Field of Classification Search
    USPC .................................. 438/745, 747, 754, 756
    See application file for complete search history.

(56) References Cited

U.S. PATENT DOCUMENTS

| | | | |
|---|---|---|---|
| 5,630,904 A | 5/1997 | Aoyama et al. | 438/669 |
| 2003/0077903 A1* | 4/2003 | Andreas et al. | 438/687 |
| 2004/0106531 A1* | 6/2004 | Kanno et al. | 510/175 |
| 2004/0142835 A1* | 7/2004 | Takashima | 510/175 |
| 2004/0229389 A1* | 11/2004 | Joei | 438/14 |

FOREIGN PATENT DOCUMENTS

| | | | |
|---|---|---|---|
| EP | 1347339 A1 * | 9/2003 | |
| KR | 10-0242144 | 11/1999 | |
| KR | 10-2005-0048096 | 2/2012 | 135/717 |

* cited by examiner

*Primary Examiner* — Binh X Tran
(74) *Attorney, Agent, or Firm* — LC Begin & Associates, PLLC

(57) ABSTRACT

A post-dry etching cleaning liquid composition for cleaning a substrate after dry etching is provided, the cleaning liquid composition containing at least one type of fluorine compound, glyoxylic acid, at least one type of organic acid salt, and water. With regard to the fluorine compound, ammonium fluoride may be used. With regard to the organic acid salt, at least one of ammonium oxalate, ammonium tartarate, ammonium citrate, and ammonium acetate may be used.

11 Claims, 11 Drawing Sheets

Infrared absorption spectra of low dielectric constant film (SiOC type)

(d)

(e)

(f)

(a)

(b)

(c)

(d)

(e)

(f)

(g)

(h)

(i)

(j)

Etching rate of p-TEOS
(25°C, 30 min treatment)

Infrared absorption spectra of
low dielectric constant film (SiOC type)

Infrared absorption spectra of
low dielectric constant film (organic type)

Etching rate

POST-DRY ETCHING CLEANING LIQUID COMPOSITION AND PROCESS FOR FABRICATING SEMICONDUCTOR DEVICE

CROSS-REFERENCE TO RELATED APPLICATIONS

This application is a Divisional Application of U.S. Utility Application Ser. No. 11/145,731 filed on Jun. 6, 2005, now abandoned.

BACKGROUND OF THE INVENTION

The present invention relates to a post-dry etching cleaning liquid composition that is used in cleaning for removing a residue after dry etching, and a process for fabricating a semiconductor device using the post-dry etching cleaning liquid composition.

DESCRIPTION OF THE RELATED ART

In recent years, accompanying the finer structure of devices due to microfabrication and the increased performance of semiconductor circuit elements, new wiring materials and interlayer insulating film materials have been employed. For example, copper and an alloy having copper as a main component (hereinafter, called a 'copper alloy') have been used as new wiring materials for the purpose of reducing wiring resistance and inter-wiring capacitance. Copper wiring is formed by, for example, a damascene process in which, after copper is embedded using sputtering or electro-plating in a trench formed as a wiring pattern in an interlayer insulating film, an unwanted copper film portion is removed using chemical mechanical polishing (CMP), etc. Similarly, with regard to the copper alloy, there are examples in which it is used for wiring by a process analogous to the damascene process.

The introduction, as a new interlayer insulating film material, of an organic film represented by an aryl ether compound, a siloxane film represented by HSQ (Hydrogen Silsesquioxane) and MSQ (Methyl Silsesquioxane), and a porous silica film, which are low dielectric constant (low-k) materials, is also being investigated.

It is however clear that copper, copper alloy, and various types of low dielectric constant films, which are the above-mentioned new materials, have low chemical resistance compared with aluminum, aluminum alloy, and silicon oxide film, which are conventional materials. Moreover, since the various types of low dielectric constant films, which are new materials, have a chemical composition different from the silicon oxide film, which is a conventional material, a process for fabricating a semiconductor device is carried out under conditions that are different from conventional ones.

In a process for fabricating a semiconductor device dry etching, in which an interlayer insulating film or a wiring material film formed on a substrate is subjected to patterning using a resist pattern as a mask, has conventionally been carried out.

As a posttreatment for such dry etching, after the resist pattern is ashed and removed by an ashing treatment, a resist residue, etc. partially remaining on the treated surface is usually removed by a resist residue remover liquid. The resist residue referred to here means all of a resist residue, which is an incompletely ashed substance remaining on the substrate surface after the ashing treatment, a side wall polymer remaining on an etched wall surface as a by-product (also called a side wall protecting film or a rabbit ear), and an organometallic polymer and a metal oxide remaining on the side face and the base face of a via hole.

In a process for producing a semiconductor device using a new material such as copper, a copper alloy, or various types of low dielectric constant film, there is the new problem that the conventional resist residue remover liquid cannot be employed. For example, a representative conventional photoresist residue remover liquid containing an alkanolamine and a quaternary ammonium compound used for removing a resist residue formed on a substrate having aluminum, an aluminum alloy, or a silicon oxide film corrodes copper and copper alloy, which have low corrosion resistance and, furthermore, causes etching and structural change in various types of low-k film.

Hence, as a new type of photoresist residue remover liquid for removing a resist residue formed on a substrate having copper, a copper alloy, or a low-k film, the following four types have been reported.

1) A liquid containing an alkanolamine, a nitrogen-containing compound as a corrosion inhibitor, and water has been disclosed. Here, the alkanolamine is N-methylaminoethanol or monoethanolamine, and the corrosion inhibitor is uric acid, adenine, caffeine, purine, etc. (ref. JP, A, 2002-99101).

2) A liquid containing either an alkanolamine or a quaternary ammonium hydroxide, a carboxyl group-containing acidic compound, a sulfur-containing compound as a corrosion inhibitor, and water has been disclosed. Here, the alkanolamine is monoethanolamine, the quaternary ammonium hydroxide is tetramethylammonium hydroxide, the sulfur-containing corrosion inhibitor is 1-thioglycerol, and the carboxyl group-containing acidic compound is acetic acid, propionic acid, or glycolic acid (ref. JP, A, 2003-76037).

3) A liquid containing an aliphatic polycarboxylic acid, a reducing material such as glyoxylic acid, and water has been disclosed by the present inventors. Here, the aliphatic polycarboxylic acid is oxalic acid, malonic acid, tartaric acid, malic acid, succinic acid, or citric acid, and the reducing material is glyoxylic acid, ascorbic acid, glucose, or mannose (ref. JP, A, 2003-167360).

4) A liquid containing one type or two or more types of fluorine compound, one type or two or more types of glyoxylic acid, etc. and water has been reported by the present inventors. Here, the fluorine compound is ammonium fluoride, and the glyoxylic acid, etc. is glyoxylic acid, ascorbic acid, glucose, fructose, lactose, or mannose (ref. JP, A, 2003-280219).

On the other hand, when the interlayer insulating film is a low dielectric constant film formed from a material that is easily altered by ashing, dry etching might be carried out using an inorganic mask. In this fabrication process, after an inorganic mask layer is formed on the interlayer insulating film, a pattern is formed on the inorganic mask by a resist, dry etching, ashing, etc., and the interlayer insulating film is subjected to dry etching using the inorganic mask (ref. JP, A, 2001-44189).

SUMMARY OF THE INVENTION

However, the above-mentioned residue remover liquids having each of the compositions 1) to 4) have the following problems. That is, with regard to the composition 1), the amount of alkanolamine makes up 40% to 90% of the remover, and the burden on the environment is large. Similarly, with regard to the composition 2), the concentration of the alkanolamine or the quaternary ammonium salt is 2 to 20 mass %, the concentration of the carboxyl group-containing acidic compound is 2 to 20 mass %, and it cannot be said that the burden on the environment is small. Furthermore, with regard to the composition 3), in an example of JP, A, 2003-167360, it is disclosed that the resist residue can be removed by immersion at 25° C. for 10 minutes. However, when the composition is used in a single wafer processing system, which has been used frequently in recent years and requires a short processing time, its removal performance is not always sufficient. This also applies to a case in which the composition is used as an etching processing liquid for removing a residue formed by etching using an inorganic mask.

Furthermore, in dry etching of a low dielectric constant film formed from a siloxane film such as HSQ or MSQ, an altered layer is formed on the etched HSQ or MSQ surface. However, the composition 4) has a very high etching rate for this altered layer. Because of this, in posttreatment cleaning for dry etching using this composition, there is a possibility that the actual etching dimensions might become larger than intended etching dimensions. Furthermore, when the conventional resist residue remover liquid is used for a semiconductor substrate after dry etching using an inorganic mask, since a silicon oxide layer, a silicon nitride layer, etc., is present as the inorganic mask on the low dielectric constant film, the low dielectric constant film underneath these layers is preferentially etched. This results in an etched shape in which an etched side wall formed from the silicon oxide layer or the silicon nitride layer overhangs in a canopy shape an etched side wall formed from the low dielectric constant film. Because of this, in the above-mentioned damascene process, the adhesion of a barrier layer formed in order to prevent diffusion of a metal wiring material such as copper that is to be embedded in an inner wall of a trench or a via hole formed by etching is insufficient. There is thus the problem that the metal wiring material diffuses within the insulating film and the resistance of embedded wiring increases.

Under such circumstances, objects of the present invention are to provide a post-dry etching cleaning liquid composition that can remove a residue formed on an etched wall face during dry etching of an insulating film without changing the etching shape and that has a suppressed burden on the environment, and to provide a process for fabricating a semiconductor device, the process being capable of completing dry etching of an insulating film with good shape precision by use of the post-dry etching cleaning liquid composition. It is also an object thereof to improve the adhesion of, for example, a barrier layer to an etched side wall in the damascene process and to thus improve the reliability of the semiconductor device.

The post-dry etching cleaning liquid composition of the present invention for accomplishing the above-mentioned objects (hereinafter, simply called a cleaning liquid composition) comprises at least one type of fluorine compound, glyoxylic acid, at least one type of organic acid salt, and water.

In the cleaning liquid composition having such a constitution, the fluorine compound is preferably ammonium fluoride. Furthermore, the organic acid salt is preferably at least one of ammonium oxalate, ammonium tartarate, ammonium citrate, and ammonium acetate. Moreover, this cleaning liquid composition may contain a surfactant and does not contain any organic solvent. Furthermore, such a post-dry etching cleaning liquid composition of the present invention is used for cleaning a substrate in which a wiring material formed from at least one of copper and a copper alloy and an interlayer insulating film formed from at least one of a low dielectric constant film and a silicon oxide film are exposed as a result of dry etching.

Due to the cleaning liquid composition with the above constitution containing the fluorine compound, a polymer residue formed, in particular, in dry etching of an insulating film using an inorganic mask is sufficiently removed. Furthermore, due to the composition containing glyoxylic acid, which is a reducing material, even if a metal material is exposed on a treatment surface that is to be treated using the cleaning liquid composition, by controlling the redox potential of the cleaning liquid composition by adjusting the concentration of glyoxylic acid therein, electron transfer between the cleaning liquid composition and the metal material is controlled, and corrosion of the metal material is prevented. Moreover, due to the composition containing the organic acid salt, which is a salt between an acid and an alkali, this organic acid salt serves as a pH adjusting agent and a buffer agent. By so doing, the concentration of $HF_2^-$, which is a silicon oxide film etchant formed by mixing the fluorine compound and glyoxylic acid, is regulated, etching of an insulating film material forming the treatment surface and an altered layer thereof is suppressed, and the ability to remove a polymer residue or a resist residue is ensured. This cleaning liquid composition is formed as an aqueous solution without using any organic solvent.

The process for fabricating a semiconductor device of the present invention is a process for carrying out a dry etching posttreatment using the above-mentioned cleaning liquid composition. In this process, a first fabrication process comprises a step of cleaning, using the post-dry etching cleaning liquid composition, a substrate that has been subjected to dry etching via a mask pattern and then to ashing removal of the mask pattern.

A second fabrication process carries out a step of patterning by dry etching an insulating film formed a substrate via a mask pattern formed on the insulating film, and a step of cleaning the substrate subjected to patterning as above by use of the above-mentioned cleaning liquid composition. The above-mentioned insulating film may be formed using a low dielectric constant material or may be formed from a low dielectric constant film with an inorganic material film thereon. Furthermore, the mask pattern may be formed from an inorganic material. Moreover, in the patterning of the insulating film, a metal material layer beneath the insulating film may be exposed. Furthermore, subsequent to the cleaning step there may be a step of covering, with a conductive thin film, an inner wall of a trench pattern formed by the patterning of the insulating film and embedding a conductive material within the trench pattern via the conductive thin film.

In such a fabrication process, after the insulating film is patterned by dry etching via the mask pattern, the cleaning posttreatment is carried out using the above-mentioned cleaning liquid composition, and a polymer residue formed as a by-product on an etched wall face during the patterning is thus removed sufficiently by the cleaning liquid composition without corroding a metal material exposed on the etched surface. Moreover, since etching of an altered layer formed on the etched surface during dry etching of the insulating film and etching of the insulating film material forming the treatment surface are suppressed, retreat of an etched side wall can be prevented.

EFFECTS OF THE INVENTION

As hereinbefore described, in accordance with the cleaning liquid composition of the present invention, since it is possible to sufficiently remove a residue formed during dry etching of an insulating film while suppressing corrosion of metal, etching of an altered layer formed on the etched surface during dry etching of the insulating film, and etching of the insulating film itself, a post-etching treatment can be carried out that is capable of removing the residue from the etched surface while maintaining the shape resulting from the etching process. Furthermore, forming the composition as an aqueous solution without using any organic solvent enables the burden on the environment to be reduced.

Furthermore, in accordance with the process for fabricating a semiconductor device of the present invention, by carrying out a cleaning posttreatment, after dry etching of an insulating film, by use of a cleaning liquid composition having the above-mentioned effects, it is possible to remove a residue from the etched surface while maintaining the shape resulting from the etching process, and it is therefore possible to complete the dry etching process with good shape precision. As a result, for example, in the damascene process, it becomes possible to improve the adhesion of a barrier layer to a side wall of a trench pattern formed by dry etching, thereby improving the reliability of the semiconductor device.

MODES FOR CARRYING OUT THE INVENTION

Figure 1:
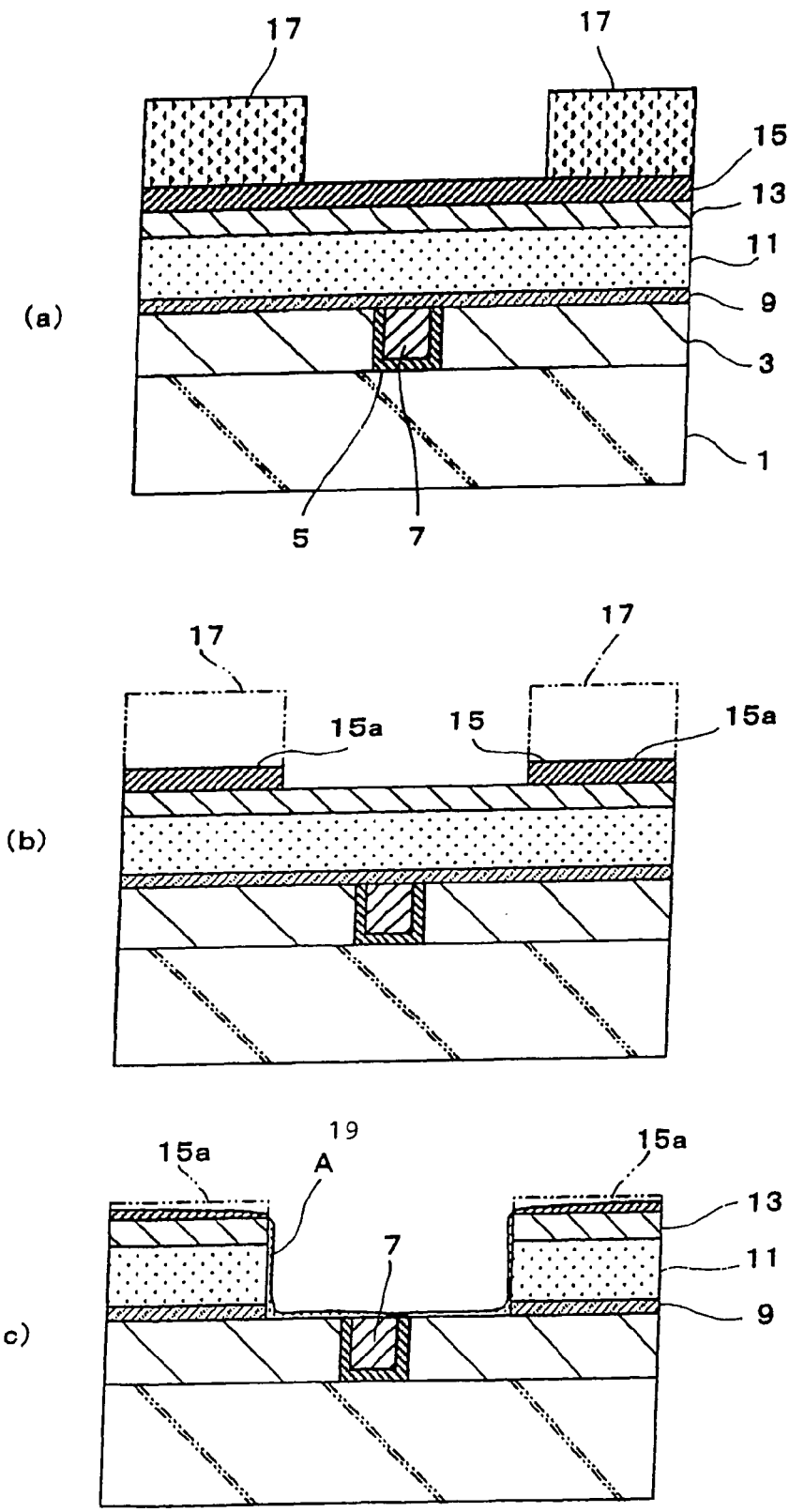
FIGS. 1A, 1B, and 1C show cross-sectional process drawings (No. 1) of a fabrication process of a first embodiment.

Modes for carrying out the present invention are explained below in the order: post-dry etching cleaning liquid composition, and process for fabricating a semiconductor device using same.

Post-Dry Etching Cleaning Liquid Composition

The post-dry etching cleaning liquid composition (hereinafter, simply called a 'cleaning liquid composition') explained here is a posttreatment liquid used suitably for a cleaning posttreatment of an insulating film patterning resulting from dry etching, and is formed as an aqueous solution comprising at least one type of fluorine compound, glyoxylic acid, at least one type of organic acid salt, and water.

Among these, the fluorine compound is contained in the cleaning liquid composition as a component for removing a residue formed during dry etching of an insulating film using an inorganic mask and a resist residue formed during ashing of a resist.

Examples of the fluorine compound include hydrofluoric acid and ammonium or amine fluoride salts such as, for example, ammonium fluoride, ammonium hydrogen fluoride, methylamine hydrofluoride, ethylamine hydrofluoride, propylamine hydrofluoride, tetramethylammonium fluoride, tetraethylammonium fluoride, ethanolamine hydrofluoride, methylethanolamine hydrofluoride, dimethylethanolamine hydrofluoride, and triethylenediamine hydrofluoride. Among these, ammonium fluoride is preferable since it has a high ability to remove a residue formed by dry etching using an inorganic mask or a resist residue formed during ashing removal of a resist pattern used as a mask when dry etching, it has a low metallic impurity content, and it is readily available. The residue referred to here means, in addition to a resist residue, which is an incompletely ashed substance remaining on the substrate surface after ashing, both a side wall polymer remaining on an etched wall face as a by-product (also called a side wall protecting film or a rabbit ear), and an organometallic polymer and a metal oxide remaining on a side face or a base face of a via hole, and also means a residue remaining on a substrate surface of a semiconductor in which an interlayer insulating film is dry etched using an inorganic mask.

Here, the above-mentioned residues have different constitutions depending on the material to be dry etched. When an interlayer insulating film, etc. on wiring formed from copper and a copper alloy is dry etched, a residue formed on an etched wall face contains a reaction product, etc. formed from a mixture of an oxide of copper, a photoresist, an inorganic mask material, the interlayer insulating film, a dry etching gas, etc. Such a residue can be removed by appropriately selecting the concentration of the fluorine compound.

The concentration of the fluorine compound in the cleaning liquid composition is therefore appropriately determined according to the target material for dry etching carried out prior to a treatment using the cleaning liquid composition, and it is preferably 0.1 to 5 mass % of the entire composition, and particularly preferably 0.2 to 3 mass %. By setting the concentration of the fluorine compound in such a range, it is possible to ensure that the fluorine compound in the cleaning liquid composition is capable of removing the polymer residue or the resist residue, while preventing the fluorine compound from corroding metal, and suppressing etching of an insulating film present on the treatment surface and changes in the structure of a low dielectric constant film present on the treatment surface. That is, if the concentration of the fluorine compound in the cleaning liquid composition is too low, the ability to remove a residue is low, and if the concentration is too high, the wiring material (metal material) is corroded and the insulating film present on the treatment surface is etched or undergoes structural change.

The glyoxylic acid contained in the cleaning liquid composition functions as an anticorrosive agent for a metal material such as copper or a copper alloy. That is, as a result of the composition containing glyoxylic acid, which is a reducing material, even when a metal material is exposed on the surface that is to be treated by the cleaning liquid composition, the redox potential can be controlled by adjusting the concentration of glyoxylic acid in the cleaning liquid composition, and electron transfer between the cleaning liquid composition and the metal material can thus be controlled, thereby preventing the metal material from being corroded. That is, corrosion of a metal in an aqueous solution depends on the pH, the redox potential, the temperature of the aqueous solution, the presence of a chelating agent, and the coexistence of another metal in the aqueous solution; in particular, the pH and the redox potential of the solution play an important role. It is surmised that, by controlling these factors, corrosion of a metal in the aqueous solution can be prevented.

The concentration of glyoxylic acid in the cleaning liquid composition is preferably 0.01 to 1 mass %, and more preferably 0.03 to 0.3 mass %. By setting the concentration of glyoxylic acid in such a range, an effect in preventing the corrosion of a metal by the glyoxylic acid in the cleaning liquid composition is ensured. On the other hand, the etching of a low dielectric constant film on the treatment surface by glyoxylic acid is suppressed. Although the ability to remove the polymer residue or the resist residue is enhanced by increasing the concentration of glyoxylic acid, this also enhances the etching of the low dielectric constant film, thus easily causing structural change; that is, by reducing the concentration of glyoxylic acid to the above-mentioned range, the etching of the low dielectric constant film and the occurrence of precipitates and crystals in the cleaning liquid composition are suppressed. Furthermore, since glyoxylic acid is expensive and is therefore economically disadvantageous, it is preferable to use it at as low a concentration as possible in the range that can give the above-mentioned performance.

As the organic acid salt contained in the cleaning liquid composition, a salt of an organic acid and ammonia is used, and examples thereof include ammonium oxalate, ammonium tartarate, ammonium citrate, and ammonium acetate.

Such an organic acid salt acts as a pH adjusting agent or a buffer agent in the cleaning liquid composition and has the function of controlling the etching of an insulating film material forming the treatment surface or an altered layer thereof. Because of this, the concentration of the organic acid salt in the cleaning liquid composition is determined from the viewpoint of the ability to remove a polymer residue resulting from the cleaning liquid composition, the ability to remove a resist residue, susceptibility to etching of an altered layer formed on the etching surface in dry etching or ashing removal of a resist pattern, the cost, and the occurrence of precipitates and crystals, and it is preferably 0.1 to 10 mass %, and more preferably 0.3 to 5 mass %.

By setting the concentration of the organic acid salt, which serves as the pH adjusting agent or the buffer agent, in the above-mentioned range in the cleaning liquid composition, the concentration of $HF_2^-$ can be adjusted so that the etching of an insulating film material forming the treatment surface and an altered layer thereof is suppressed while ensuring that the polymer residue or the resist residue can be removed, $HF_2^-$ being a silicon oxide film etchant formed by mixing a fluorine compound and glyoxylic acid. That is, if the concentration of the organic acid salt is too high, the ability to remove the polymer residue and the resist residue by the cleaning liquid composition is degraded. On the other hand, if the concentration of the organic acid salt is too low, susceptibility to etching of the insulating film material forming the treatment surface and an altered layer thereof by the cleaning liquid composition becomes high. Moreover, by maintaining the concentration of the organic acid salt at a certain level, an effect in suppressing variation in pH due to dilution and concentration of the remover liquid when the cleaning liquid composition is recycled can be obtained.

The above-mentioned cleaning liquid composition may further contain a surfactant for the purpose of imparting affinity toward a water-repellent material layer. The surfactant used for such a purpose is preferably a nonionic type or anionic type surfactant. The concentration of the surfactant is 0.0001 to 10 mass %, and particularly preferably 0.001 to 5 mass %. By setting the concentration in such a range, it is possible to ensure that the wettability toward the insulating film is commensurate with the concentration of the surfactant.

Furthermore, the above-mentioned cleaning liquid composition may contain a resist removal component. Examples of the resist removal component include TMAH (tetramethylammonium hydroxide) and MEA (monomethanolamine). This can give an effect in removing the resist residue in particular.

Since the cleaning liquid composition having the above-mentioned constitution of the present invention contains a fluorine compound, the polymer residue formed during dry etching of an insulating film, particularly when using an inorganic mask, can be removed sufficiently. Moreover, since the composition contains glyoxylic acid, even if a metal material is exposed on the etching surface, corrosion of the metal material can be suppressed. Furthermore, since the composition contains an organic acid salt, it is possible to ensure that the polymer residue and the resist residue can be removed while suppressing etching of an altered layer formed on the etching surface during dry etching of the insulating film. Furthermore, since the composition is formulated as an aqueous solution without using any organic solvent, the burden on the environment can be suppressed.

It is therefore possible to carry out a post-etching cleaning treatment that can remove polymer residue from the etched surface while maintaining the shape obtained by etching. It is also possible to suppress the burden on the environment by making up the cleaning liquid composition as an aqueous solution without using any organic solvent.

Furthermore, since this cleaning liquid composition contains an organic acid salt as described above and thus has a buffering function, it is possible to suppress variation in pH due to dilution or concentration of the cleaning liquid composition. This suppresses fluctuation in the ability to remove the polymer residue and the resist residue and the etching of the treatment surface from being caused by a change in the concentration of components contained in the cleaning liquid composition. It is therefore possible to enhance the solution life of the cleaning liquid composition when it is recycled.

Process for Fabricating Semiconductor Device—1

A first embodiment of the process for fabricating a semiconductor device using the cleaning liquid composition described above is now explained in detail by reference to drawings. In the first embodiment below, an embodiment in which the fabrication process of the present invention is applied to the damascene process is explained.

Firstly, as shown in FIG. 1A, an insulating film 3 is formed from, for example, silicon oxide on a semiconductor substrate 1 on which a semiconductor element (not illustrated) such as a transistor has been formed in advance. A plug 7 connected to an element or a conductive layer on the semiconductor substrate 1 surface via a barrier layer 5 is formed within a via hole formed in the insulating film 3. The barrier layer 5 is formed as a layered film in which a titanium nitride layer is provided on a titanium layer, and this plug 7 is formed from, for example, tungsten (W).

A stopper insulating film formed from silicon nitride (SiN) is formed by deposition using a vacuum CVD method on the insulating film 3 in which the plug 7 has been embedded. Subsequently, a low dielectric constant insulating film (low-k film) 11, a cap insulating film 13 formed from silicon oxide and, further, an inorganic mask layer 15 formed from silicon nitride are formed by deposition using a CVD method. As the low dielectric constant film 11, an organic material film represented by an aryl ether compound, a siloxane film represented by HSQ (Hydrogen Silsesquioxane) and MSQ (Methyl Silsesquioxane), an SiOC type film, or a porous silica film is used.

A resist pattern 17 having a desired wiring trench pattern is then formed on the inorganic mask layer 15 by lithography.

Following this, as shown in FIG. 1B, the inorganic mask layer 15 is etched using the resist pattern 17 as a mask, thus forming an inorganic mask 15*a* in which the wiring trench pattern of the resist pattern 17 is transferred to the inorganic mask layer 15. After the etching, the resist pattern 17 is removed by ashing.

Subsequently, as shown in FIG. 1C, the cap insulating film 13 and the low dielectric constant insulating film 11 are dry etched through the inorganic mask 15*a*, the etching is stopped at the surface of the stopper layer 9, and a step of etching the stopper layer 9 is subsequently carried out, thus forming a wiring trench (trench pattern) 19. For this dry etching; for example, a two frequency CCP (capacitively coupled plasma) system is used.

In this dry etching step, a polymer residue A is formed on the etched wall face. If carbon is contained in each insulating film that is to be etched, the same polymer residue A is formed.

Figure 2:
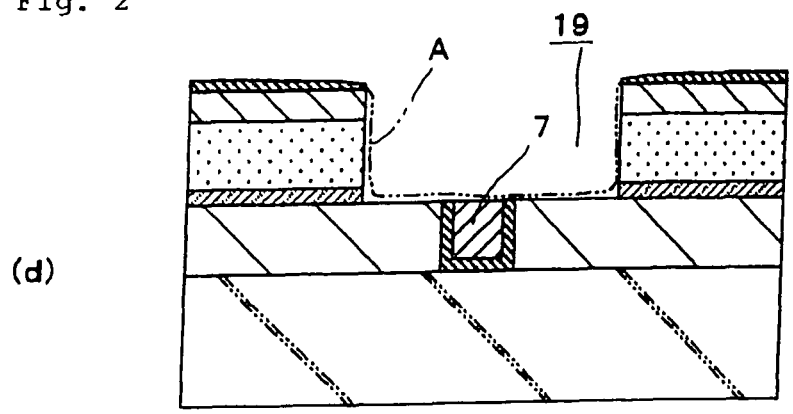
FIGS. 2D, 2E, and 2F show cross-sectional process drawings (No. 2) of the fabrication process of the first embodiment.
Figure 2:
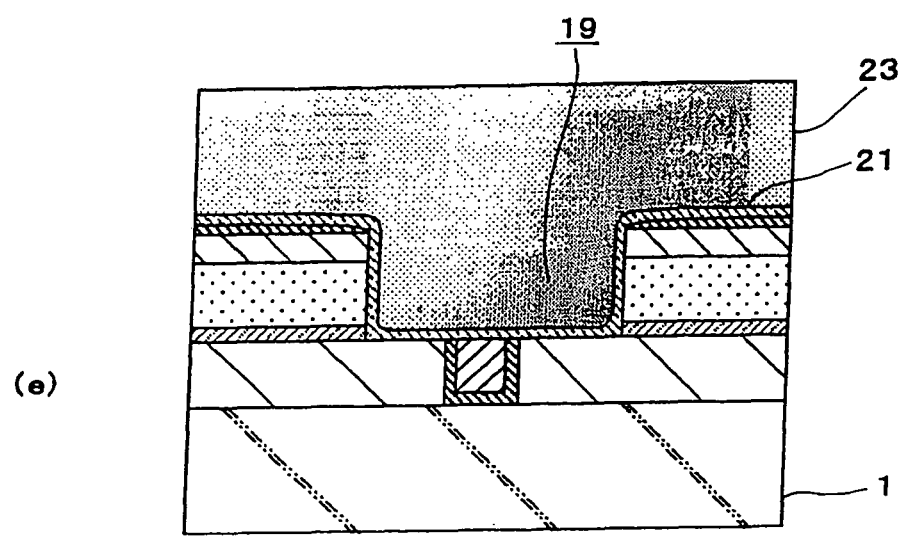
Figure 2:
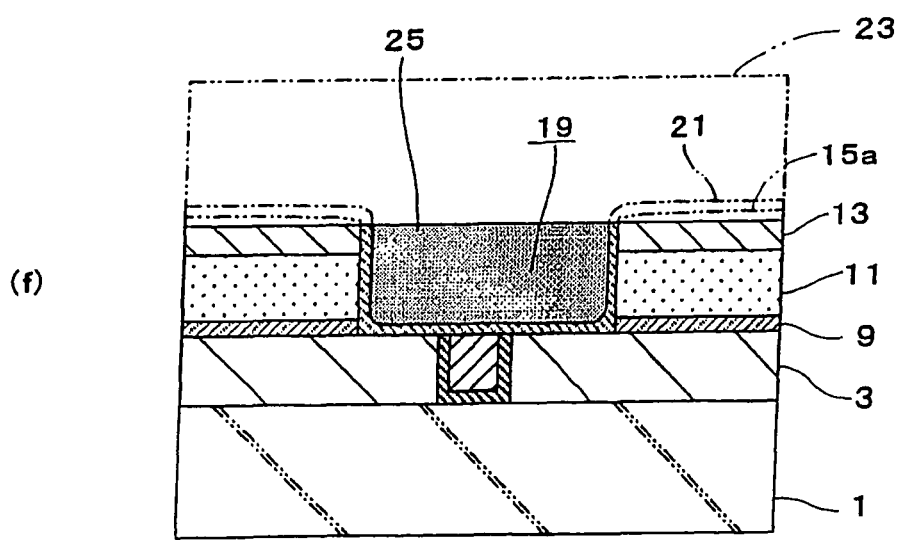

As shown in FIG. 2D, as a post-dry etching treatment, a cleaning posttreatment using the above-mentioned cleaning liquid composition is carried out. In this case, a wet treatment in which the substrate to be treated is immersed in the above-mentioned cleaning liquid composition for a predetermined period of time (e.g., 300 seconds) is carried out, thereby removing the polymer residue A, followed by rinsing with pure water by a standard method and then a drying treatment.

After the above-mentioned procedure, as shown in FIG. 2E, a barrier layer 21 is formed from TaN, etc. on the entire surface above the semiconductor substrate 1 by, for example, a sputtering method as a conductive thin film for the purpose of preventing wiring metal from diffusing. Subsequently, for example, a Cu thin film for plating is formed, and a conductive material 23 such as copper (Cu) is deposited within the wiring trench 19 by a plating method, thus filling in the wiring trench 19.

Following this, as shown in FIG. 2F, the conductive material 23 deposited outside the wiring trench 19, the barrier layer 21, and the remaining inorganic mask 15*a* are removed by a CMP method, etc. By so doing, embedded wiring 25 is formed in which Cu is embedded as a conductive material within the wiring trench 19 formed in the stopper layer 9, the low dielectric constant film 11, and the cap insulating film 13.

In the above-mentioned fabrication process, in order to remove the polymer residue A formed during dry etching of various types of insulating films 9 to 13 using the inorganic mask 15*a* as described by reference to FIG. 1C, a cleaning posttreatment using the above-mentioned cleaning liquid composition of the present invention is carried out as described by reference to FIG. 2D. This cleaning liquid composition is, as described above, an aqueous solution comprising a fluorine compound, glyoxylic acid, and an organic acid salt, and by post-cleaning using this cleaning liquid composition it is possible to remove the polymer residue A sufficiently without corroding the plug 7, which is a metal material exposed on the etched surface. Moreover, in etching or dry etching of the insulating films 9 to 13 formed from an organic material or an inorganic material, since etching of an altered layer formed on the etched surface of the low dielectric constant film 11 is suppressed, it is possible to prevent the etched side wall from retreating. It is therefore possible to maintain the etched shape formed by dry etching using the inorganic mask 15*a*.

Therefore, during the cleaning posttreatment, the shape of the opening of the wiring trench 19 does not widen, and a dry etching process including the posttreatment step can be completed with good shape precision. Furthermore, with respect to the cap insulating film 13 formed from an inorganic material such as silicon oxide, the low dielectric constant film 11 underneath does not retreat as a result of the cleaning posttreatment and the side walls of the wiring trench 19 do not take on a canopy shape. Because of this, when the barrier layer 21 is formed as described by reference to FIG. 2E, the barrier layer 21 can be provided with good adhesion to the side walls of the wiring trench 19. As a result, the barrier layer 21 can adequately prevent the conductive material (Cu) 23 from diffusing into the insulating films 9 to 13, thereby enhancing the reliability of the semiconductor device.

Process for Fabricating Semiconductor Device—2

The process for fabricating a semiconductor device of a second embodiment is now explained. The second embodiment explains an embodiment in which the fabrication process of the present invention is applied to a dual damascene process, which is carried out subsequent to the step explained by reference to FIGS. 1A to 1C and FIGS. 2D to 2F in the first embodiment.

Figure 3:
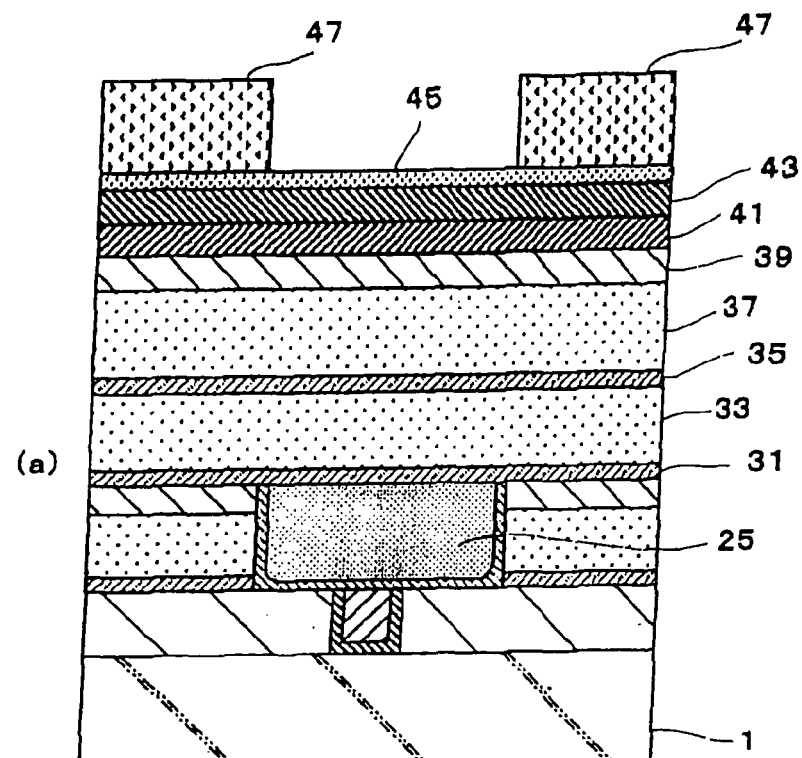
FIGS. 3A and 3B show cross-sectional process drawings (No. 1) of a fabrication process of a second embodiment.
Figure 3:
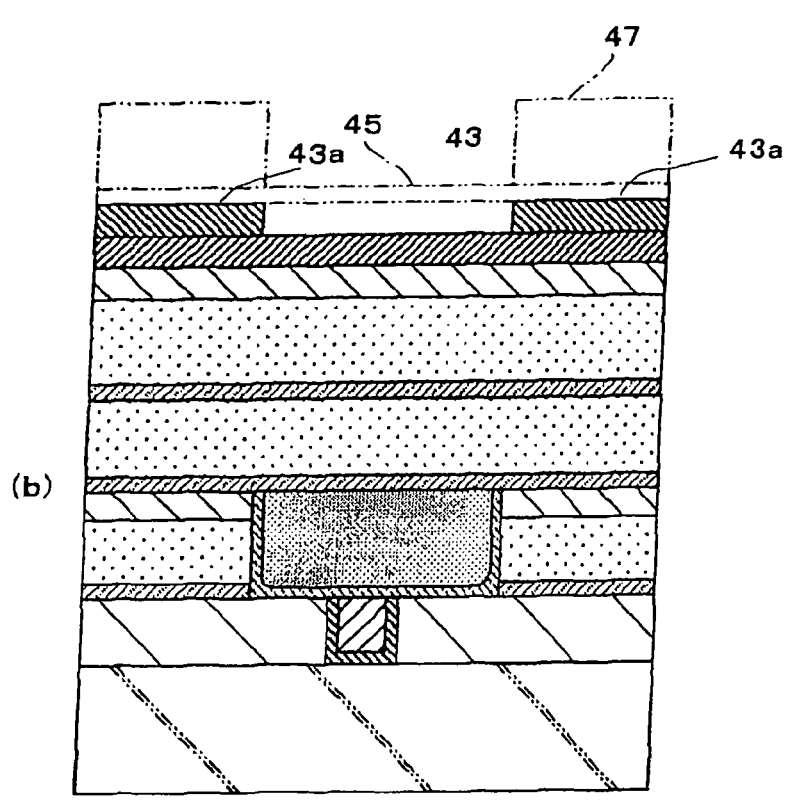

Firstly, as shown in FIG. 3A, after embedded wiring 25 is formed from Cu, for example, as in the above-mentioned FIGS. 1A to 1C and FIGS. 2D to 2F, a stopper layer 31, a low dielectric constant film 33, a stopper layer 35, a low dielectric constant film 37, and a cap insulating film 39 are layered in sequence by, for example, a CVD method above a semiconductor substrate 1 on which the embedded wiring 25 is formed. The stopper layers 31 and 35 are formed from, for example, SiC, and the cap insulating film 39 is formed from silicon oxide. The low dielectric constant films 33 and 37 employ an organic material film represented by an aryl ether compound, a siloxane film represented by HSQ (Hydrogen Silsesquioxane) and MSQ (Methyl Silsesquioxane), a SiOC type film, or a porous silica film.

Following this, a first inorganic mask layer 41 formed from silicon nitride (or silicon oxide), a second inorganic mask layer 43 formed from silicon oxide (or silicon nitride), and an anti-reflection film 45 for exposure in lithography are formed in sequence on the cap insulating film 39.

Following this, a resist pattern 47 having a predetermined wiring trench pattern is formed on the anti-reflection film 45.

Following this, as shown in FIG. 3B, the anti-reflection film 45 and the second inorganic mask layer 43 are etched through the resist pattern 47, thus forming a second inorganic mask 43*a* to which the wiring trench pattern of the resist pattern 47 has been transferred. Subsequently, the resist pattern 47 and the anti-reflection film 45 are removed by ashing.

Figure 4:
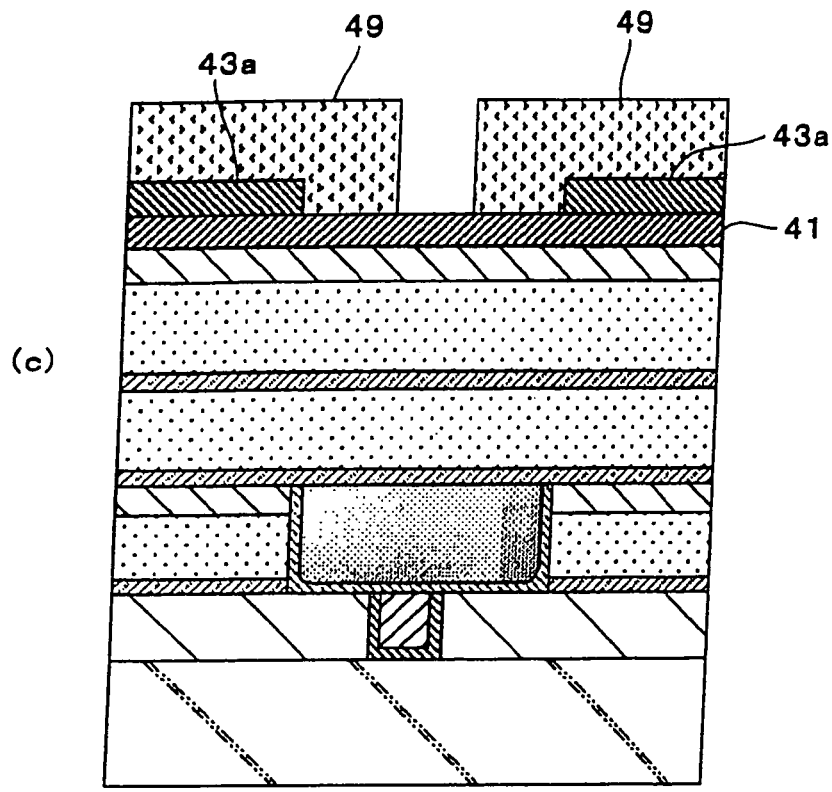
FIGS. 4C and 4D show cross-sectional process drawings (No. 2) of the fabrication process of the second embodiment.
Figure 4:
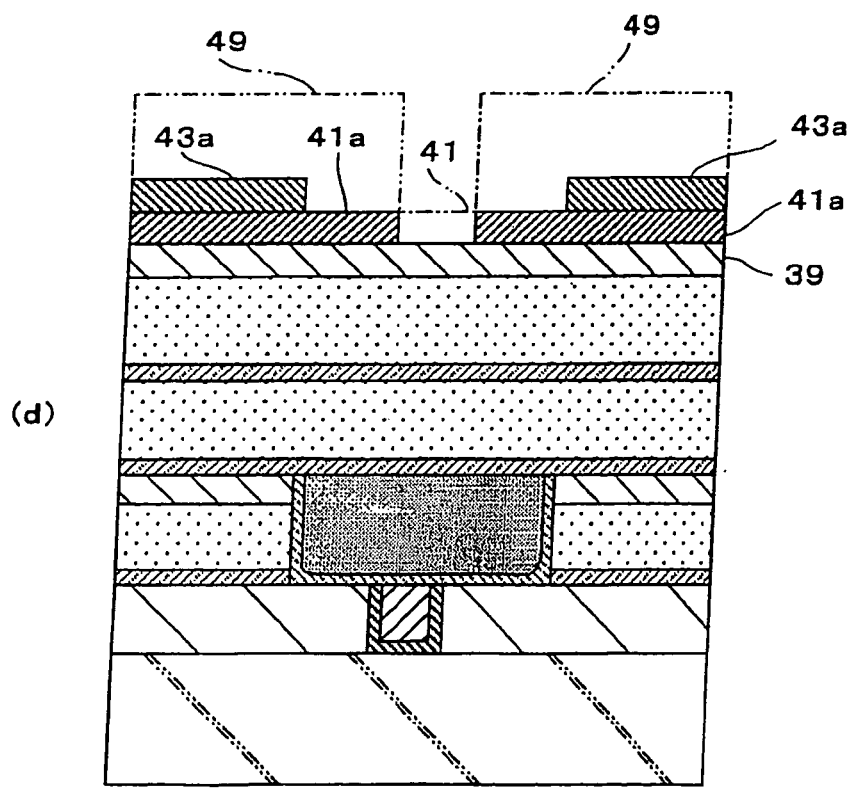

Following this, as shown in FIG. 4C, a resist pattern 49 is formed on the first inorganic mask layer 41, the resist pattern 49 covering the second inorganic mask 43*a* and having a via hole pattern positioned within the wiring trench pattern formed in the second inorganic mask 43*a*.

Subsequently, as shown in FIG. 4D, the first inorganic mask layer 41 is etched through the resist pattern 49, thus forming a first inorganic mask 41*a* to which the via hole pattern of the resist pattern 49 has been transferred. The resist pattern 49 is then removed by ashing.

Figure 5:
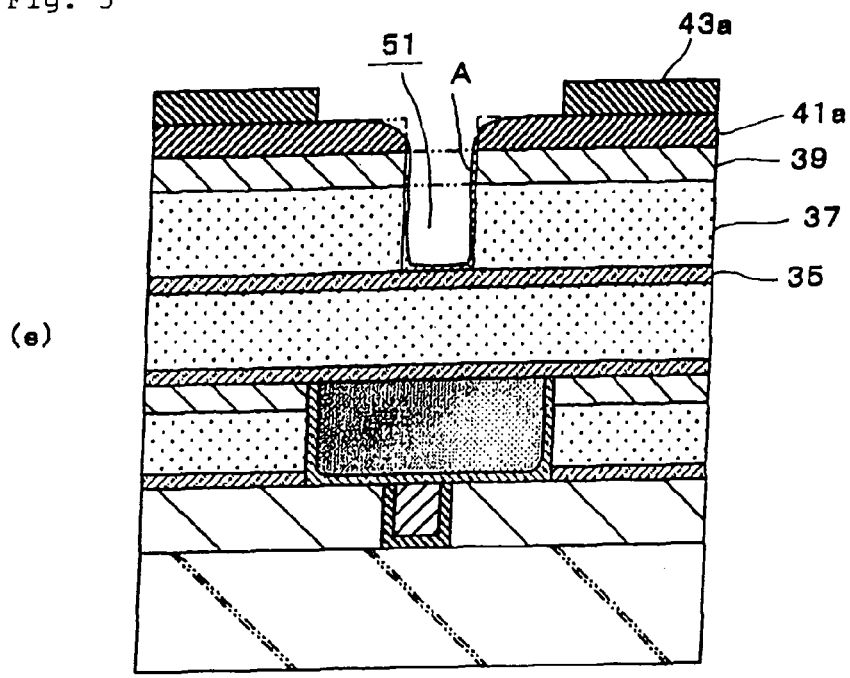
FIGS. 5E and 5F show cross-sectional process drawings (No. 3) of the fabrication process of the second embodiment.
Figure 5:
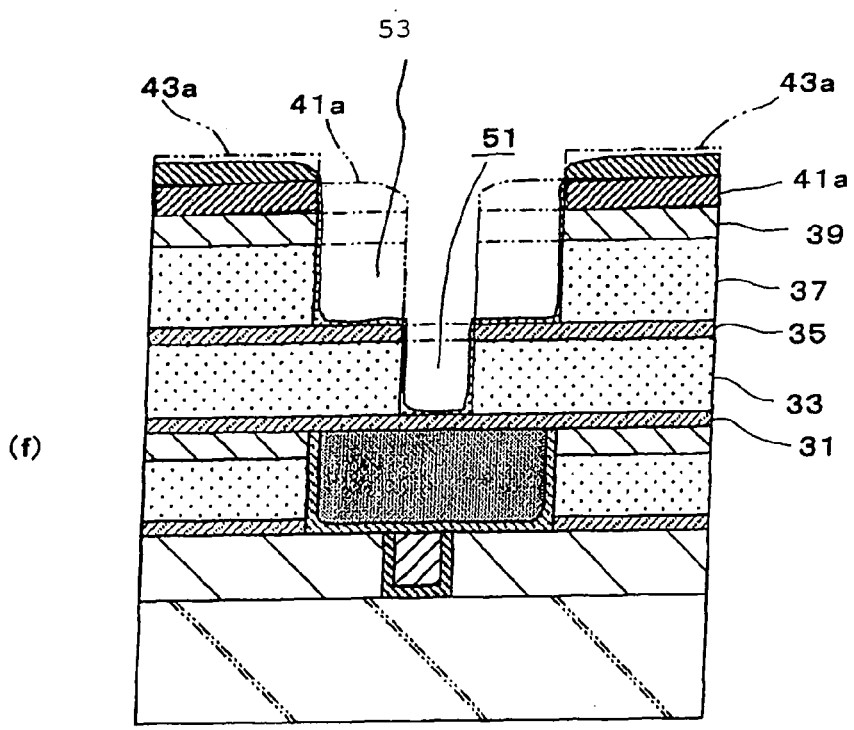

Following this, as shown in FIG. 5E, the cap insulating film 39 and the low dielectric constant film 37 are dry etched through the first inorganic mask 41*a* to which the via hole pattern has been transferred, and this dry etching is stopped at the stopper layer 35. By so doing, an aperture 51 having a via hole pattern is formed.

Subsequently, as shown in FIG. 5F, the first inorganic mask 41a, the cap insulating film 39, and the low dielectric constant insulating film 37 are dry etched through the second inorganic mask 43a to which the wiring trench pattern has been transferred, and the etching is stopped at the stopper layer 35. By so doing, a wiring trench 53 is formed. In this etching, at the same time as the wiring trench 53 being formed, the stopper layer 35 and the low dielectric constant film 33 at the base of the aperture 51 are dry etched, and the etching is first stopped at the surface of the stopper layer 31. By so doing, the aperture 51 is further dug down into while being connected to the wiring trench 53.

Figure 6:
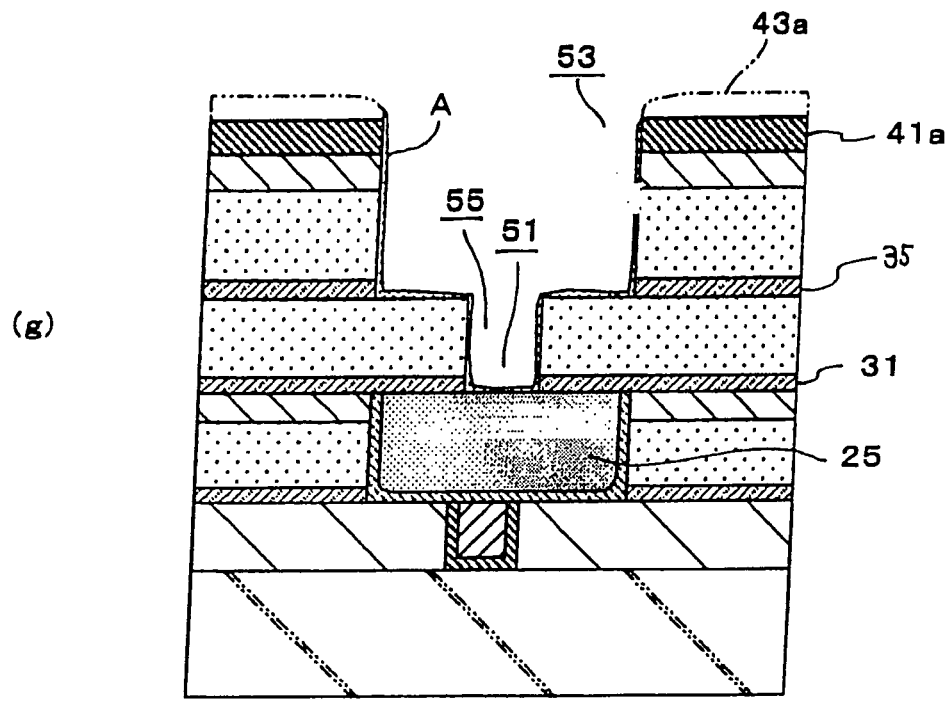
FIGS. 6G and 6H show cross-sectional process drawings (No. 4) of the fabrication process of the second embodiment.
Figure 6:
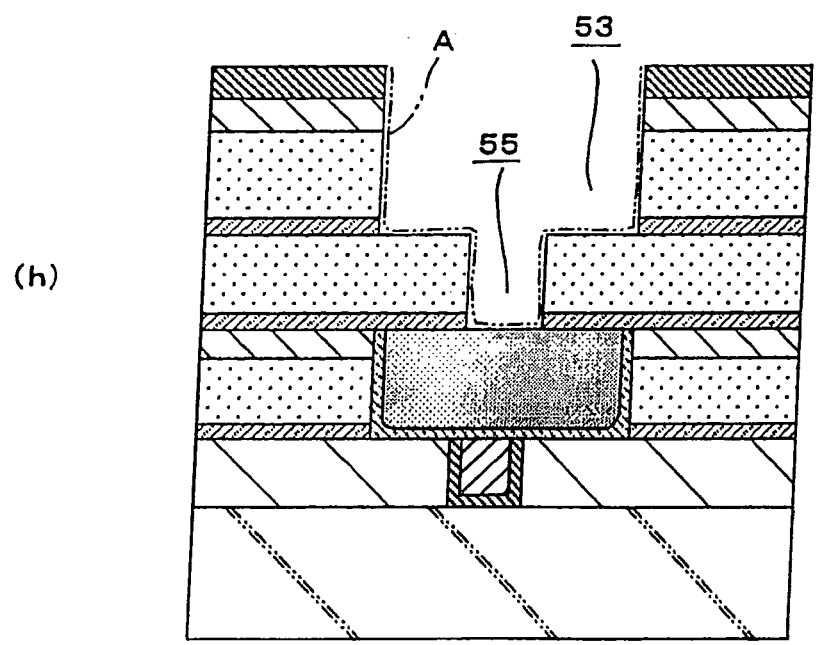

Following this, as shown in FIG. 6G, the stopper layer 31 at the base of the aperture 51 is dry etched. By so doing, the wiring trench 53 and a via hole 55 extending to the embedded wiring 25 formed from Cu are formed, the via hole 55 being dug down from the base of the wiring trench 53. In this etching, the second inorganic mask 43a on the first inorganic mask 41a and the stopper layer 35 are also simultaneously etched and removed.

In this dry etching step, a polymer residue A is formed on the etched wall face. If carbon is contained in each insulating film to be etched, the same polymer residue A is formed. In the above-mentioned dry etching explained by reference to FIG. 5F, the same polymer residue is formed on the etched wall face.

As shown in FIG. 6H, a cleaning posttreatment using the above-mentioned cleaning liquid composition is carried out as a post-dry etching treatment. In this case, a wet treatment in which the substrate to be treated is immersed in the above-mentioned cleaning liquid composition for a predetermined period of time (e.g., 300 seconds) is carried out, thereby removing the polymer residue A, followed by rinsing with pure water by a standard method and then a drying treatment.

Figure 7:
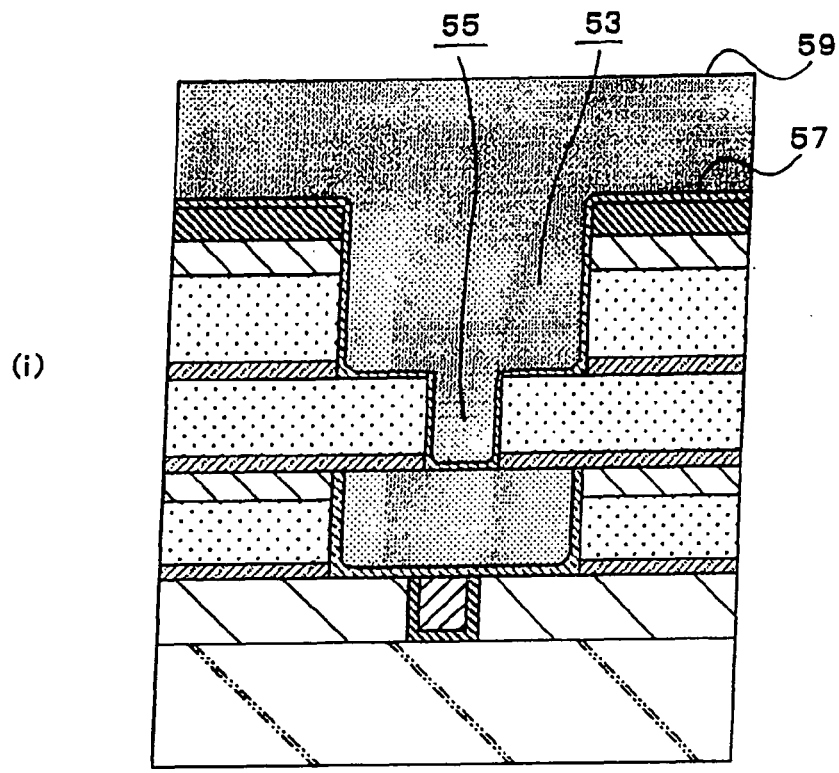
FIGS. 7I and 7J show cross-sectional process drawings (No. 5) of the fabrication process of the second embodiment.
Figure 7:
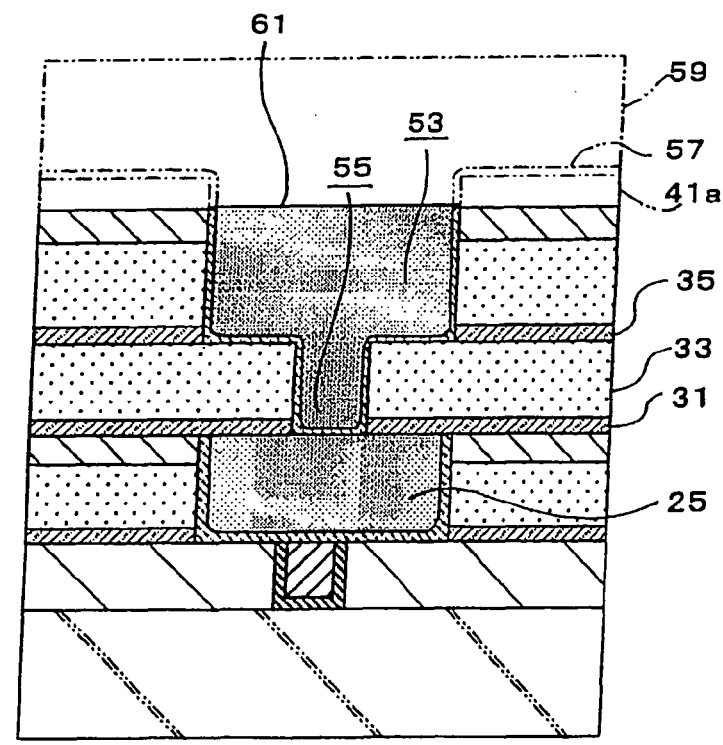

After the above-mentioned procedure, as shown in FIG. 7I, a barrier layer 57 of TaN, etc. is formed on the entire surface above the semiconductor substrate 1 by, for example, a sputtering method as a conductive thin film for the purpose of preventing wiring metal from diffusing. After this, for example, a Cu thin film for plating is formed, and a conductive material 59 such as copper (Cu) is then deposited within the wiring trench 53 and the via hole 55 opening on the base thereof by a plating method, thus filling in the wiring trench 53 and the via hole 55.

Following this, as shown in FIG. 7J, the conductive material 59 and the barrier layer 57 deposited outside the wiring trench 53, and the remaining first inorganic mask 41a are removed by the CMP method. By so doing, embedded wiring 61 is formed in which Cu is embedded as a conductive material within the wiring trench 53 and the via hole 55.

In the above-mentioned fabrication process, as explained by reference to FIG. 5F and FIG. 6G, in order to remove the polymer residue A formed during dry etching of the various types of insulating films 31 to 39 using the inorganic masks 41a and 43a, a cleaning posttreatment using the above-mentioned cleaning liquid composition of the present invention is carried out as explained by reference to FIG. 6H. Because of this, as in the first embodiment, the polymer residue A can be removed sufficiently while maintaining the etched shape as it is without corroding the embedded wiring 25 of the metal material Cu. It is therefore possible to complete the dry etching process including the posttreatment step with good shape precision. As a result, the barrier layer 57 can be provided with good adhesion to a side wall of a trench pattern formed from the wiring trench 53 and the via hole 55, thereby enhancing the reliability of the semiconductor device.

The above-mentioned second embodiment explains a procedure in which, after the final dry etching step explained by reference to FIG. 6G, a cleaning posttreatment using the above-mentioned cleaning liquid composition is carried out. However, in the second embodiment, in the dry etching step explained by reference to FIG. 5E and the dry etching step explained by reference to FIG. 5F, the polymer residue A might be formed. Therefore, after each of these steps, a cleaning posttreatment using the above-mentioned cleaning liquid composition may be carried out. By so doing, the polymer residue A formed in each dry etching step can be removed as it forms, and it is possible to prevent the polymer residue A from affecting the subsequent dry etching.

In the first embodiment and the second embodiment explained above, as a cleaning posttreatment for dry etching of various types of insulating films using an inorganic mask, an arrangement using the cleaning liquid composition of the present invention is explained. However, the present invention is not limited to such an arrangement. For example, dry etching of various types of insulating films including the above-mentioned low dielectric constant film is carried out by etching using a resist pattern as a mask, the resist pattern is subsequently removed by ashing and, after that, a cleaning posttreatment for removing a resist residue formed during this ashing may be carried out using the cleaning liquid composition of the present invention.

In this case, it is preferable to use in the cleaning posttreatment a cleaning liquid composition containing, in addition to the fluorine compound, glyoxylic acid, and the organic acid salt, a resist removal component such as TMAH or MEA. By so doing, the resist residue after ashing can be removed sufficiently while maintaining the etched shape as it is without corroding the embedded wiring 25 of the metal material Cu.
Process for Fabricating Semiconductor Device—3

As a third embodiment of the process for fabricating a semiconductor device using the above-mentioned cleaning liquid composition, an embodiment in which the present invention is applied to a step of connecting a plug to a transistor provided on the surface side of a semiconductor substrate is now explained.

Figure 8:
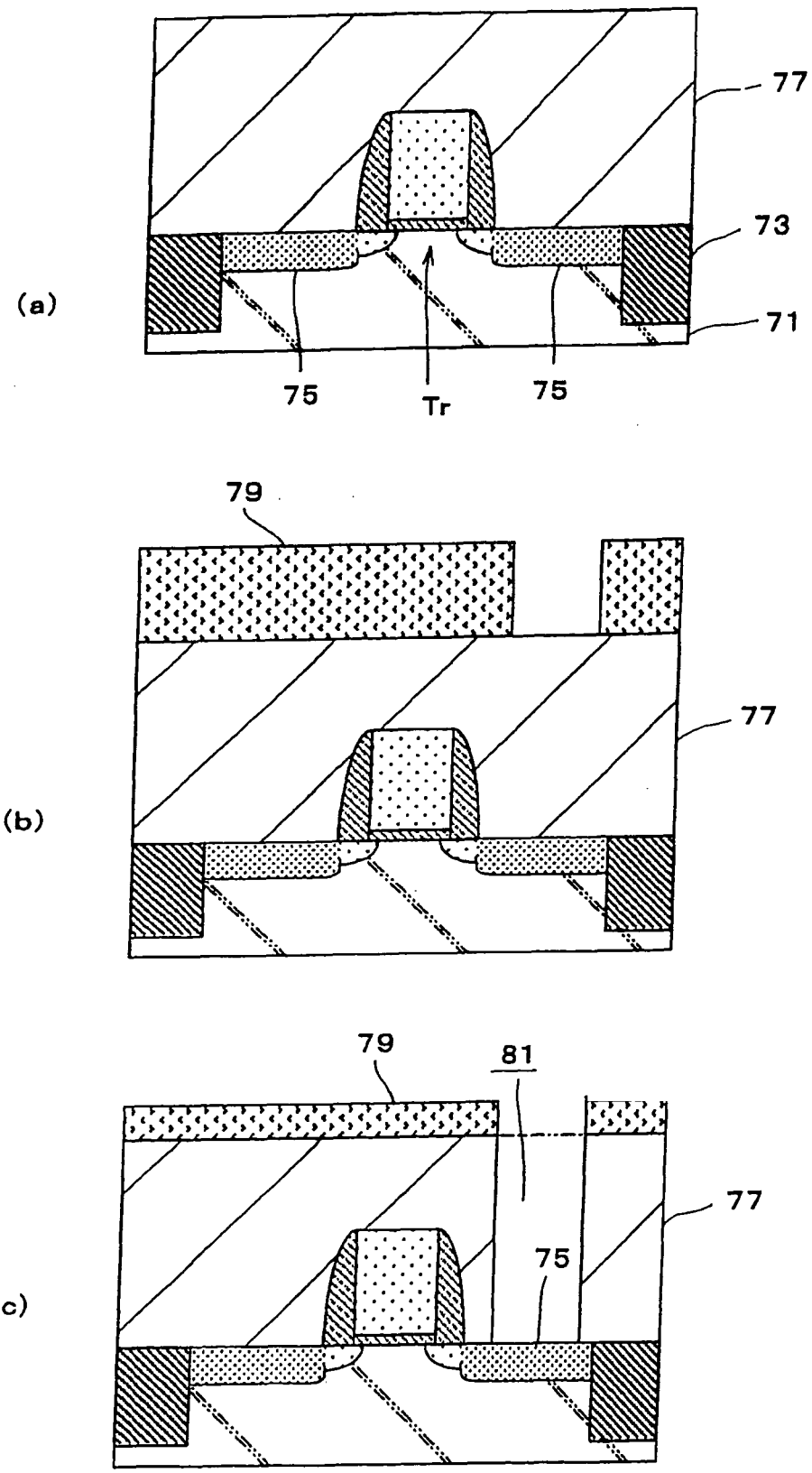
FIGS. 8A, 8B, and 8C show cross-sectional process drawings (No. 1) of a fabrication process of a third embodiment.

Firstly, as shown in FIG. 8A, the surface side of a semiconductor substrate 71 is separated by an element separator 73, and a MOS transistor Tr is then formed in a region separated by this element separator 73. With regard to this MOS transistor Tr, an exposed face of a source/drain 75 is covered by a silicide film, the illustration of which is omitted here. This silicide film is formed from nickel silicide, cobalt silicide, titanium silicide, etc.

An interlayer insulating film 77 is formed from silicon oxide by a vacuum CVD method on the semiconductor substrate 71 on which the MOS transistor Tr has been formed, and the MOS transistor Tr is covered by the interlayer insulating film 77.

Following this, as shown in FIG. 8B, a resist pattern 79 having a via hole pattern is formed on the interlayer insulating film 77.

Next, as shown in FIG. 8C, by dry etching of the interlayer insulating film 77 using the resist pattern 79 as a mask, a via hole 81 that extends to the source/drain 75 covered by the silicide is formed as a trench pattern.

Figure 9:
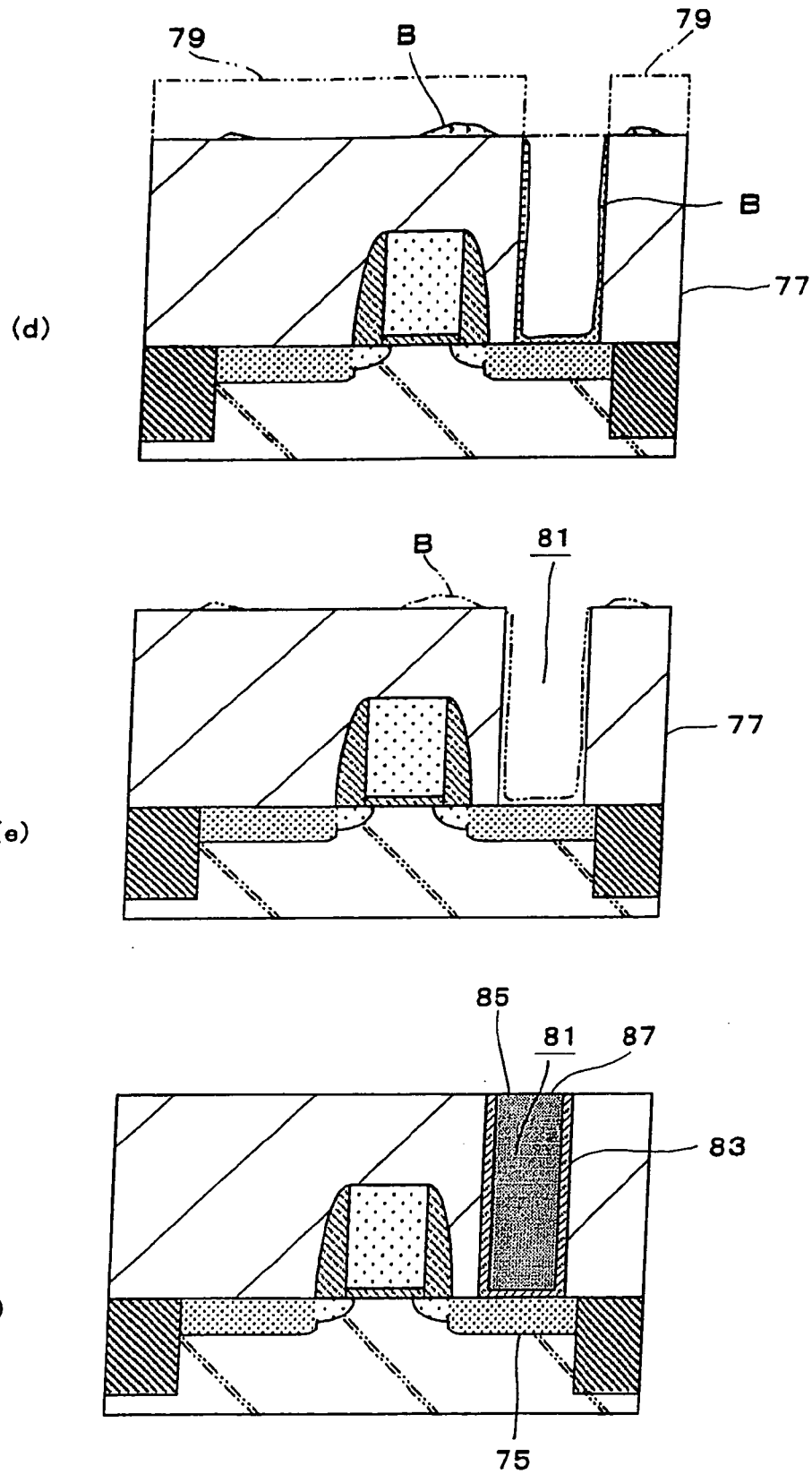
FIGS. 9D, 9E, and 9F show cross-sectional process drawings (No. 2) of the fabrication process of the third embodiment.

Subsequently, as shown in FIG. 9D, the resist pattern 79 remaining after the previous dry etching step is removed by ashing. As a result, a resist residue B containing a by-product polymer is formed on the treatment surface exposed during the ashing.

As shown in FIG. 9E, by carrying out a cleaning posttreatment using the cleaning liquid composition, the resist residue B is removed. In this case, a wet treatment in which the substrate to be treated is immersed in the above-mentioned cleaning liquid composition for a predetermined period of time is carried out, followed by rinsing with pure water by a standard method and then a drying treatment. Among the above-mentioned cleaning liquid compositions, it is particularly preferable to use a cleaning liquid composition containing a resist removal component such as TMAH (tetramethylammonium hydroxide) or MEA (monomethanolamine).

After the above-mentioned procedure, as shown in FIG. 9F, a film is formed from a conductive material 85 such as W by the CVD method via a barrier film 83 of TiN, Ti, etc. formed by, for example, a sputtering method for the purposes of preventing a wiring metal from diffusing and improving the adhesion, thus filling in the via hole 81. The conductive material 85 and the barrier film 83 deposited outside the via hole 81 are then removed by the CMP method, thus leaving them only within the via hole 81. By so doing, a plug 87 that is embedded within the via hole 81 via the barrier film 83 and connected to the source/drain 75 is formed.

In the third embodiment described above, as explained by reference to FIG. 9D, in order to remove the resist residue B formed during ashing removal of the resist pattern 79, which is used as a mask during dry etching, a cleaning posttreatment using the above-mentioned cleaning liquid composition of the present invention is carried out as explained by reference to FIG. 9E. This cleaning liquid composition is an aqueous solution comprising a fluorine compound, glyoxylic acid, and an organic acid salt as described above, and post cleaning by use of this cleaning liquid composition enables the resist residue B to be removed sufficiently without corroding a silicide (source/drain plug 87), which is a metal material exposed on the etching surface. Moreover, since etching of the interlayer insulating film 77 is suppressed, an etched side wall is prevented from retreating. It is therefore possible to maintain the etched shape formed by dry etching as it is.

By the use of, in particular, a cleaning liquid composition comprising a resist removal component such as TMAH or MEA in the cleaning posttreatment, a sufficient ability to remove the resist residue B can be obtained.

The third embodiment describes an arrangement in which the cleaning liquid composition of the present invention is used for a cleaning posttreatment in the formation by dry etching of the via hole 81 extending to the source/drain 75, which is covered by the silicide. However, even when the surface of the source/drain 75 is not the silicide but is a semiconductor layer, by carrying out a cleaning posttreatment using the cleaning liquid composition of the present invention, it is possible to reliably remove the resist residue B. Because of this, it is possible to reliably connect the plug 87 and the source/drain 75 while maintaining the etched shape with good precision.

EXAMPLES

Results of evaluation tests described below for cleaning liquid compositions of Examples of the present invention are now explained.

Evaluation Test—1

Cleaning posttreatment for dry etching was carried out using cleaning liquid compositions of Examples and cleaning liquid compositions of Comparative Examples corresponding to these Examples, and removal characteristics of a polymer residue, corrosion of a metal material, and susceptibility to etching of an insulating film were evaluated.

A treatment substrate for this cleaning posttreatment was formed as follows by reference to FIG. 6G of the above-mentioned embodiment. That is, after embedded wiring 25 was formed from copper above a semiconductor substrate 1, a stopper insulating film 31 formed from SiC, a low dielectric constant insulating film 33 formed from SiOC, a low dielectric constant insulating film 37 formed from a polyaryl ether, a first inorganic mask 41a formed from silicon nitride, and a second inorganic mask 43a formed from silicon oxide were layered on the embedded wiring 25, and the insulating layers thus layered were dry etched through the second inorganic mask 43a, thus forming a via hole 55 extending to a wiring trench 53 and the embedded wiring 25 of a dual damascene structure. By carrying out dry etching in this way, a polymer residue A was formed on an etched wall face. Such a treatment substrate was subjected to a cleaning posttreatment using cleaning liquid compositions of each of the Examples and the Comparative Examples. In this cleaning posttreatment, the treatment substrate that had been subjected to dry etching was immersed in the cleaning liquid composition (25° C.) for 3 minutes, followed by rinsing with running superpure water and drying.

With regard to the treated substrate which had been subjected to the above-mentioned cleaning posttreatment, the ability to remove the polymer residue A, corrosion of copper forming the embedded wiring 25, and the susceptibility to etching of the insulating films of the various materials were examined using an electron microscope.

Table 1 below shows the constitutions and the results of the evaluation tests of the cleaning liquid compositions of Examples 1 to 16. Table 2 below shows the constitutions and the results of the evaluation tests of the treatment liquids of Comparative Examples 1 to 13. Comparative Example 5 is a resist remover having a constitution referred to in JP, A, 2002-99101, Comparative Examples 11 and 12 are resist removers having constitutions referred to in JP, A, 2003-280219, and Comparative Example 13 is a resist remover having a constitution referred to in JP, A, 2003-167360.

TABLE 1

| Post-dry etching cleaning liquid composition (mass %) | | | | | | Removability *4 | | Corrosion Copper | Susceptibility to etching *5 | | |
|---|---|---|---|---|---|---|---|---|---|---|---|
| | | | | | | | Trench pattern | | Organic low dielectric | SiOC low dielectric | |
| | Fluorine compound | | Glyoxylic acid | Organic acid salt | | Copper surface | side wall | | constant film | constant film | Silicon oxide |
| Ex. 1 | NH$_4$F | 0.2 | 0.03 | Triammonium citrate | 0.3 | A | A | A | A | A | A |
| Ex. 2 | NH$_4$F | 1.5 | 0.03 | Triammonium citrate | 2.0 | A | A | A | A | A | A |

TABLE 1-continued

| | Post-dry etching cleaning liquid composition (mass %) | | | | | Removability *4 | | | Susceptibility to etching *5 | | |
|---|---|---|---|---|---|---|---|---|---|---|---|
| | Fluorine compound | | Glyoxylic acid | Organic acid salt | | Copper surface | Trench pattern side wall | Corrosion Copper | Organic low dielectric constant film | SiOC low dielectric constant film | Silicon oxide |
| Ex. 3 | NH$_4$F | 3.0 | 0.03 | Triammonium citrate | 5.0 | A | A | A | A | A | A |
| Ex. 4 | NH$_4$F | 1.5 | 0.3 | Triammonium citrate | 2.0 | A | A | A | A | A | A |
| Ex. 5 | NH$_4$F | 3.0 | 0.3 | Triammonium citrate | 5.0 | A | A | A | A | A | A |
| Ex. 6 | TMAH *1 + HF | 0.5 | 0.06 | Triammonium citrate | 1.0 | A | A | A | A | A | A |
| Ex. 7 | MEA *2 + HF | 0.5 | 0.06 | Triammonium citrate | 1.0 | A | A | A | A | A | A |
| Ex. 8 | NH4F | 0.5 | 0.06 | Triammonium citrate | 1.0 | A | A | A | A | A | A |
| Ex. 9 | TMAH + HF | 0.5 | 0.06 | Triammonium citrate | 1.0 | A | A | A | A | A | A |
| Ex. 10 | MEA + HF | 0.5 | 0.06 | Ammonium acetate | 1.0 | A | A | A | A | A | A |
| Ex. 11 | NH$_4$F | 0.5 | 0.06 | Ammonium oxalate | 1.0 | A | A | A | A | A | A |
| Ex. 12 | TMAH + HF | 0.5 | 0.06 | Ammonium acetate | 1.0 | A | A | A | A | A | A |
| Ex. 13 | MEA + HF | 0.5 | 0.06 | Ammonium acetate | 1.0 | A | A | A | A | A | A |
| Ex. 14 | NH$_4$F | 0.5 | 0.06 | Ammonium tartarate | 1.0 | A | A | A | A | A | A |
| Ex. 15 | TMAH + HF | 0.5 | 0.06 | Ammonium tartarate | 1.0 | A | A | A | A | A | A |
| Ex. 16 | MEA + HF | 0.5 | 0.06 | Ammonium tartarate | 1.0 | A | A | A | A | A | A |

*1: TMAH—tetramethylammonium hydroxide
*2: MEA—monoethanolamine
*4: A—good, B—some remaining, C—impossible to remove
*5: A—(corrosion, etching) none, B—(corrosion, etching) slight, C—(corrosion, etching) some

TABLE 2

| | Post-dry etching cleaning liquid composition (mass %) | | | | | Removability *4 | | | Susceptibility to etching *5 | | |
|---|---|---|---|---|---|---|---|---|---|---|---|
| | | | | | | Copper surface | Trench pattern side wall | Corrosion Copper | Organic low dielectric constant film | SiOC low dielectric constant film | Silicon oxide |
| Comp. Ex. 1 | TMAH *1 | 1.0 | — | | | A | C | C | B | B | A |
| Comp. Ex. 2 | MEA *2 | 1.0 | — | | | A | C | C | B | B | A |
| Comp. Ex. 3 | TMAH | 1.0 | DMAC *3 | 50.0 | | A | C | B | B | B | A |
| Comp. Ex. 4 | MEA | 1.0 | DMAC | 50.0 | | A | C | B | B | B | A |
| Comp. Ex. 5 | MEA | 1.0 | Benzotriazole | 1.0 | | A | C | A | B | B | A |
| Comp. Ex. 6 | HF | 1.0 | — | | | A | A | A | A | C | C |
| Comp. Ex. 7 | NH$_4$F | 1.0 | — | | | C | B | A | A | A | A |
| Comp. Ex. 8 | HF | 1.0 | DMAC | 50.0 | | A | A | A | B | B | B |
| Comp. Ex. 10 | NH$_4$F | 1.0 | DMAC | 50.0 | | C | C | A | B | A | A |
| Comp. Ex. 11 | NH$_4$F | 0.2 | Glyoxylic acid | 0.03 | | A | A | A | A | A | C |
| Comp. Ex. 12 | NH$_4$F | 0.2 | Glyoxylic acid | 0.09 | | A | A | A | A | A | C |
| Comp. Ex. 13 | Oxalic acid | 3.4 | Glyoxylic acid | 0.1 | | A | C | A | A | A | A |

*1: TMAH—tetramethylammonium hydroxide
*2: MEA—monoethanolamine
*3: DMAC—dimethylacetamide
*4: A—good, B—some remaining, C—impossible to remove
*5: A—(corrosion, etching) none, B—(corrosion, etching) slight, C—(corrosion, etching) some As shown in Table 1, it has been confirmed that in cleaning posttreatment with the cleaning liquid compositions of Examples 1 to 16, the polymer residue formed during dry etching can be removed sufficiently from the copper (Cu) surface and the trench pattern side wall. It has also been confirmed that corrosion of the copper (Cu) surface is prevented. It has also been confirmed that susceptibility to etching of various types of insulating films such as the organic low dielectric constant film, the SiOC low dielectric constant film, and the silicon oxide film is sufficiently suppressed.

In contrast, as shown in Table 2, with regard to cleaning liquid compositions having a constitution other than that of the present invention, none among the ability to remove a polymer residue, the effect of preventing copper (Cu) from being corroded, and the effect of suppressing etching of various types of insulating films could be obtained adequately.

Evaluation Test—2

The etching characteristics of the cleaning liquid composition toward a silicon oxide film were evaluated.

Figure 10:
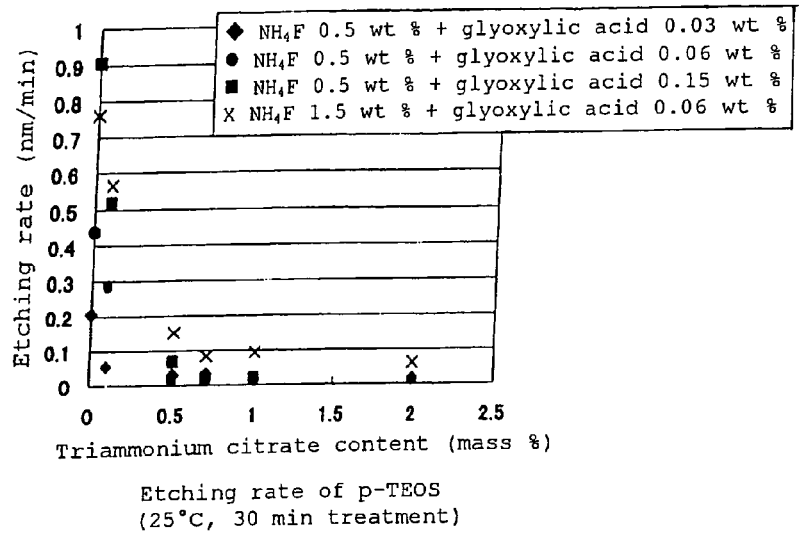
FIG. 10 is a graph showing the etching rate for a silicon oxide film by each constitution of cleaning liquid composition.

Treatment substrates were prepared by forming a P-TEOS film as a silicon oxide film on a silicon wafer, and the total film thickness of the treatment substrate was measured using an interferometric film thickness measurement system (Nanospec AFT manufactured by Nanometrics). Subsequently, these treatment substrates were immersed in cleaning liquid compositions of each constitution (25° C.) for 30 minutes, followed by rinsing with running superpure water and drying. Following this, the total film thickness of the treated substrate was measured again using the interferometric film thickness measurement system. The etching rate for the silicon oxide film was calculated from the film thicknesses before and after the cleaning posttreatment with the cleaning liquid composition. FIG. 10 shows the results of calculation of the etching rate with respect to the constitution of the cleaning liquid compositions and the amount of triammonium citrate contained therein.

From the results shown in FIG. 10, it has been confirmed that by adjusting the amount of ammonium citrate contained in the composition the etching rate for the P-TEOS film can be suppressed. It has also been confirmed that the cleaning liquid composition of the present invention containing ammonium citrate suppresses the etching of an oxide film, and in cleaning posttreatment for dry etching using the cleaning liquid composition of the present invention, degradation of the etched shape of the oxide film can be prevented.

Evaluation Test—3

The influence of a cleaning liquid composition on the structure of a low dielectric constant film was evaluated.

Figure 11:
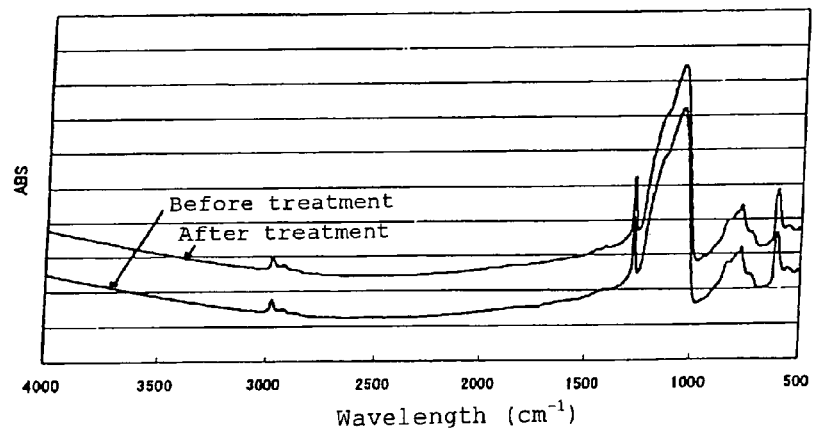
FIG. 11 shows infrared absorption spectra for evaluating the influence of a cleaning liquid composition on the structure of a low dielectric constant film (SiOC type).
Figure 12:
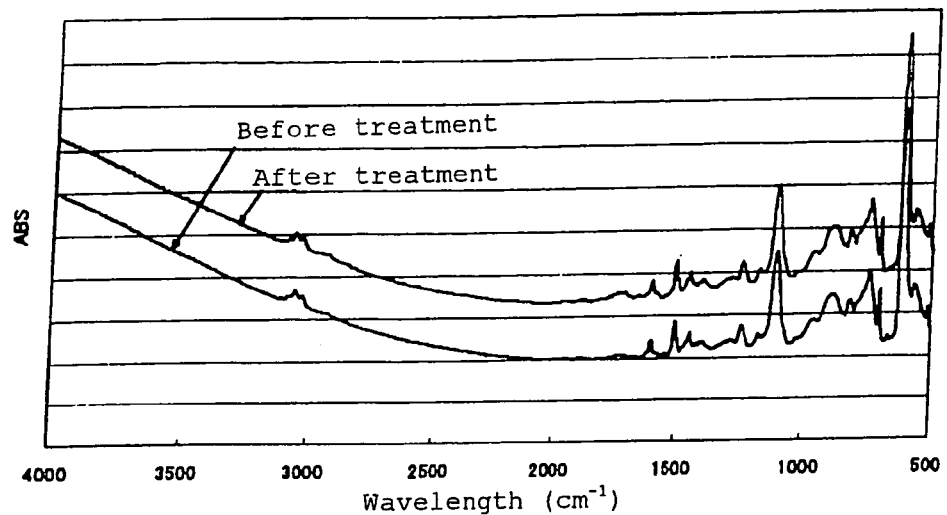
FIG. 12 shows infrared absorption spectra for evaluating the influence of a cleaning liquid composition on the structure of a low dielectric constant film (organic type).

Here, a treatment substrate in which an SiOC low dielectric constant film was formed on a silicon wafer and a treatment substrate in which an organic low dielectric constant film formed from an arylether compound was formed on a silicon wafer were prepared Infrared absorption spectra of the low dielectric constant films forming the surface of each of the treatment substrates were measured using a Fourier transform infrared spectrophotometer (FT-IR-660V manufactured by JASCO Corporation). The treatment substrates were subsequently immersed in a cleaning liquid composition (25° C.) for 30 minutes, followed by rinsing with running superpure water and drying. The constitution of the cleaning liquid composition was $NH_4F$=1.5 mass %, glyoxylic acid=0.03 mass %, and triammonium citrate=1.0 mass %. Following this, infrared absorption spectra of each of the low dielectric constant films were measured again using the Fourier transform infrared spectrophotometer. FIG. 11 shows infrared absorption spectra measured for the SiOC low dielectric constant film, and FIG. 12 shows infrared absorption spectra measured for the organic low dielectric constant film.

As shown in these figures, there was no change in the infrared absorption spectra before and after the cleaning posttreatment for both the SiOC low dielectric constant film and the organic low dielectric constant film. This suggests that the cleaning liquid composition does not cause any structural change in either of the low dielectric constant films. It has been confirmed from this that in a post-dry etching cleaning treatment using the cleaning liquid composition of the present invention, an increase in dielectric constant of a low dielectric constant film due to structural change can be suppressed.

Evaluation Test—4

The etching characteristics of the cleaning liquid composition toward a low dielectric constant film were evaluated.

Figure 13:
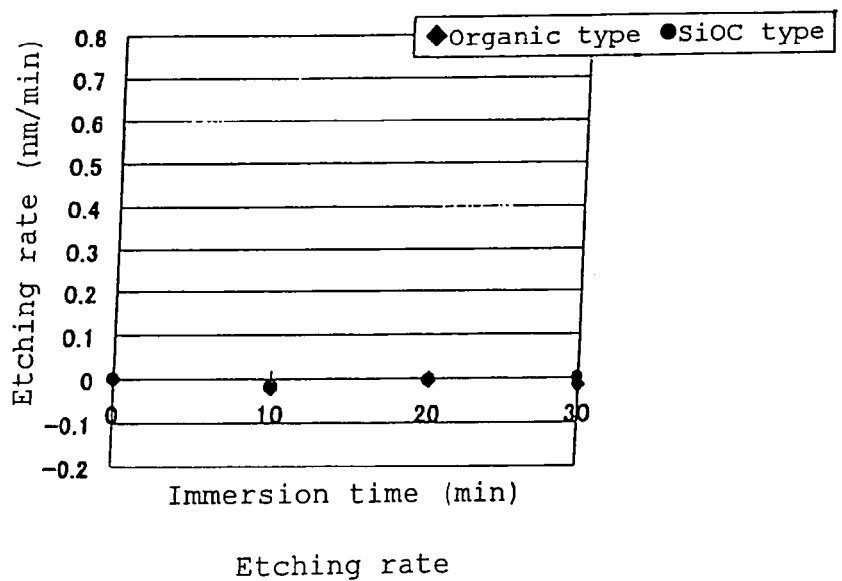
FIG. 13 is a graph showing the etching rate for a low dielectric constant film of a cleaning liquid composition.

Here, a treatment substrate in which an SiOC low dielectric constant film was formed on a silicon wafer and a treatment substrate in which an organic low dielectric constant film formed from an arylether compound was formed on a silicon wafer were prepared. The total film thickness of the treatment substrates was measured using an interferometric film thickness measurement system (Nanospec AFT manufactured by Nanometrics). Subsequently, these treatment substrates were immersed in a cleaning liquid composition (25° C.) for 10 to 30 minutes, followed by rinsing with running superpure water and drying. The constitution of the cleaning liquid composition was $NH_4F$=1.5 mass %, glyoxylic acid=0.03 mass %, and triammonium citrate=1.0 mass %. Following this, the total film thickness of the treated substrates was measured again using the interferometric film thickness measurement system. The etching rate for the low dielectric constant film was calculated from the film thicknesses before and after the cleaning posttreatment with the cleaning liquid composition. FIG. 13 shows the results of calculation of the etching rate with respect to the immersion time in the cleaning liquid composition.

From the results shown in FIG. 13, it has been confirmed that the etching rate for each of the low dielectric constant films is within the error limits of the measurement system, and the cleaning liquid composition having the constitution of the present invention does not etch any of the low dielectric constant films. In a post-dry etching cleaning treatment using the cleaning liquid composition having the constitution of the present invention, degradation of the etched shape of the low dielectric constant film can be prevented.

Evaluation Test—5

A substrate that had been subjected to an ashing treatment after dry etching was subjected to a cleaning posttreatment using cleaning liquid compositions of each of the Examples and the corresponding Comparative Examples, and the removal characteristics of a photoresist residue, corrosion of a metal material, and susceptibility to etching of an insulating film were evaluated.

As a treatment substrate for this cleaning posttreatment, a substrate that had been subjected to the following process was used. That is, after an interlayer insulating film (SiOC low dielectric constant film) was formed on a substrate in which Cu damascene wiring was formed on a silicon wafer using tantalum (Ta) as a barrier metal, a resist pattern was formed on this interlayer insulating film by lithography. A via hole extending to the Cu damascene wiring was subsequently formed by dry etching using this resist pattern as a mask, and the resist pattern was then removed by an ashing treatment. By so doing, a treatment substrate on the surface of which a polymer residue and a photoresist residue had been formed was obtained.

Such a treatment substrate was subjected to a cleaning posttreatment using the cleaning liquid compositions of each of the Examples and the Comparative Examples. In this cleaning posttreatment, the treatment substrates after being subjected to the ashing treatment were immersed in the cleaning liquid compositions (25° C.) for 3 minutes, followed by rinsing with running superpure water and drying.

With regard to the treatment substrates that had been subjected to cleaning posttreatment, the ability to remove the polymer residue and the photoresist residue, the corrosion of Cu damascene wiring (copper), and the susceptibility to etching of the SiOC low dielectric constant film were confirmed by an electron microscope.

Table 3 below shows the constitution and the results for each of the evaluation tests of the cleaning liquid compositions of Examples 17 to 28 and the constitution and the results for each of the evaluation tests of the treatment liquids of Comparative Examples 14 to 16. Comparative Examples 14 and 15 are resist removers referred to in JP, A, 2003-280219, and Comparative Example 16 is a resist remover referred to in JP, A, 2003-167360.

TABLE 3

| | Post-dry etching cleaning liquid composition (mass %) | | | | Removability *4 | | Susceptibility to etching *5 |
|---|---|---|---|---|---|---|---|
| | Fluorine compound | | Glyoxylic acid | Organic acid salt | Copper surface | Via hole side wall | Corrosion Copper | SiOC low dielectric constant film |
| Ex. 17 | NH₄F | 0.2 | 0.06 | Triammonium citrate 0.5 | A | A | A | A |
| Ex. 18 | NH₄F | 0.2 | 0.06 | Triammonium citrate 1.0 | A | A | A | A |
| Ex. 19 | NH₄F | 1.0 | 0.06 | Triammonium citrate 0.5 | A | A | A | A |
| Ex. 20 | NH₄F | 1.0 | 0.06 | Triammonium citrate 1.0 | A | A | A | A |
| Ex. 21 | NH₄F | 1.8 | 0.06 | Triammonium citrate 1.0 | A | A | A | A |
| Ex. 22 | NH₄F | 1.8 | 0.06 | Triammonium citrate 2.0 | A | A | A | A |
| Ex. 23 | NH₄F | 1.8 | 0.15 | Triammonium citrate 1.0 | A | A | A | A |
| Ex. 24 | NH₄F | 1.8 | 0.15 | Triammonium citrate 2.0 | A | A | A | A |
| Ex. 25 | TMAH *1 + HF | 0.5 | 0.06 | Triammonium citrate 1.0 | A | A | A | A |
| Ex. 26 | MEA *2 + HF | 0.5 | 0.06 | Triammonium citrate 1.0 | A | A | A | A |
| Ex. 27 | NH₄F | 0.5 | 0.06 | Ammonium oxalate 1.0 | A | A | A | A |
| Ex. 28 | NH₄F | 0.5 | 0.06 | Ammonium tartarate 1.0 | A | A | A | A |
| Comp. Ex. 14 | NH₄F | 0.2 | | Glyoxylic acid 0.03 | B | A | A | C |
| Comp. Ex. 15 | NH₄F | 0.2 | | Glyoxylic acid 0.09 | B | A | A | C |
| Comp. Ex. 16 | Oxalic acid | 3.4 | | Glyoxylic acid 0.1 | A | C | A | A |

*1: TMAH—tetramethylammonium hydroxide
*2: MEA—monoethanolamine
*4: A—good, B— some remaining, C—impossible to remove
*5: A—(corrosion, etching) none, B—(corrosion, etching) slight, C—(corrosion, etching) some As shown in Table 3, it has been confirmed that, in a cleaning posttreatment using the cleaning liquid compositions of Examples 17 to 28, the polymer residue and the photoresist residue formed by dry etching can be removed sufficiently from the copper (Cu) surface and the via hole side wall. It has also been confirmed that corrosion of the copper (Cu) surface can be prevented. It has also been confirmed that the susceptibility to etching of the SiOC low dielectric constant film can be suppressed sufficiently. In contrast, with regard to the cleaning liquid compositions having a constitution other than that of the present invention, none among the ability to remove the polymer residue and the photoresist residue, the effect in preventing copper (Cu) from being corroded, and the effect in suppressing etching of the low dielectric constant film could be obtained adequately.

What is claimed is:

1. A process for fabricating a semiconductor device, the process comprising:
    a step of cleaning, using a post-dry etching cleaning liquid composition, a substrate that has been subjected to ashing removal of a mask pattern after dry etching through the mask pattern,
    wherein the substrate is provided with a wiring material formed from at least one of copper and a copper alloy, and an interlayer insulating film formed from at least one of a low dielectric constant film and silicon oxide, which are exposed by dry etching,
    wherein the post-dry etching cleaning liquid composition comprises at least one type of fluorine compound, glyoxylic acid, at least one type of organic acid salt, and water,
    wherein said organic acid salt is selected from the group consisting of at least one of ammonium oxalate, ammonium tartrate, and ammonium citrate, and said process does not use an organic solvent.

2. The process for fabricating a semiconductor device according to claim 1, wherein the post-dry etching cleaning liquid composition comprises:
    from 0.1 to 5 mass % of at least one type of fluorine compound;
    from 0.01 to 1 mass % of glyoxylic acid;
    from 0.1 to 10 mass % of at least one type of said organic acid salt; and
    water.

3. The process for fabricating a semiconductor device according to claim 1, wherein the fluorine compound is ammonium fluoride.

4. The process for fabricating a semiconductor device according to claim 1, wherein the cleaning liquid composition further comprises a surfactant.

5. A process for fabricating a semiconductor device, the process comprising:
    a step of patterning an insulating film formed above a substrate by dry etching through a mask pattern formed on the insulating film; and
    a step of cleaning, as a post-patterning treatment using a post-dry etching cleaning liquid composition, the substrate that has been subjected to the patterning of the insulating film,
    wherein the substrate is provided with a wiring material formed from at least one layer selected from a copper layer and a copper alloy layer, and an interlayer insulating film formed from at least one of a low dielectric constant film and silicon oxide, which are exposed by dry etching,
    wherein the post-dry etching cleaning liquid composition comprises at least one type of fluorine compound, glyoxylic acid, at least one type of organic acid salt, and water,
    wherein said organic acid salt is selected from at least one of the group consisting of ammonium oxalate, ammonium tartrate, and ammonium citrate, and said process does not use an organic solvent.

6. The process for fabricating a semiconductor device according to claim 5, wherein the post-dry etching cleaning liquid composition comprises:
    from 0.1 to 5 mass % of at least one type of fluorine compound;
    from 0.01 to 1 mass % of glyoxylic acid;
    from 0.1 to 10 mass % of at least one type of said organic acid salt; and
    water.

7. The process for fabricating a semiconductor device according to claim 5, wherein the insulating film is formed using a low dielectric constant material.

8. The process for fabricating a semiconductor device according to claim 5, wherein the insulating film is formed from a low dielectric constant film with an inorganic material film thereon.

9. The process for fabricating a semiconductor device according to claim 5, wherein the mask pattern is formed from an inorganic material.

10. The process for fabricating a semiconductor device according to claim 5, wherein said copper or copper alloy layer beneath the insulating film is exposed by patterning of the insulating film.

11. The process for fabricating a semiconductor device according to claim 5, wherein after the cleaning step an inner wall of a trench pattern formed by patterning of the insulating film is covered by a conductive thin film, and a conductive material is embedded within the trench pattern via the conductive thin film.

\* \* \* \* \*